United States Patent [19]
Sato et al.

[11] 4,204,169
[45] May 20, 1980

[54] MUTING CIRCUIT IN AN ELECTRONIC TUNING TYPE RECEIVER

[75] Inventors: Reisuke Sato; Tomohisa Yokogawa, both of Kawagoe, Japan

[73] Assignee: Pioneer Electronic Corporation, Tokyo, Japan

[21] Appl. No.: 913,925

[22] Filed: Jun. 8, 1978

[30] Foreign Application Priority Data

Jun. 10, 1977 [JP] Japan .................. 52/68496

[51] Int. Cl.² .................. H04B 1/10
[52] U.S. Cl. .................. 455/175; 455/180; 455/186; 455/194
[58] Field of Search ............ 325/455, 456, 457, 458, 325/459, 464, 465, 468, 348, 478; 358/191, 192

[56] References Cited
U.S. PATENT DOCUMENTS

| | | | |
|---|---|---|---|
| 3,777,289 | 12/1973 | Makino | 325/465 |
| 3,882,400 | 5/1975 | Hamada | 325/456 |
| 3,968,440 | 7/1976 | Ehni | 325/464 |
| 4,085,372 | 4/1978 | Mogi et al. | 325/464 |

Primary Examiner—Robert L. Griffin
Assistant Examiner—Jin F. Ng
Attorney, Agent, or Firm—Sughrue, Rothwell, Mion, Zinn and Macpeak

[57] ABSTRACT

Muting is provided for a receiver during preset channel selection by using the output signals from each channel selection switch to energize a muting circuit. During manual channel selection or during the resetting operation no muting is provided.

5 Claims, 1 Drawing Figure

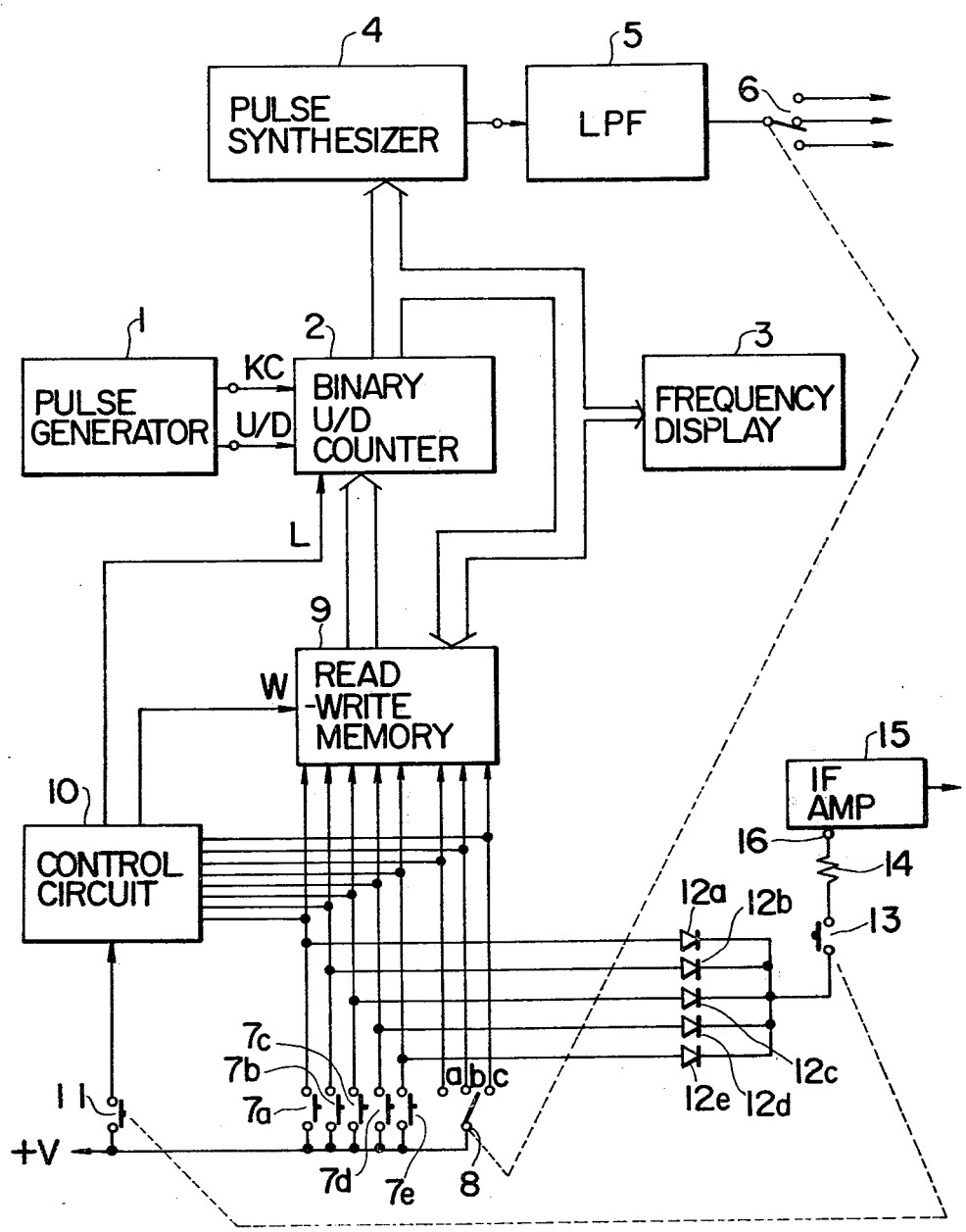

MUTING CIRCUIT IN AN ELECTRONIC TUNING TYPE RECEIVER

BACKGROUND OF THE INVENTION

This invention relates to electronic tuning type recievers, and more particularly to a muting circuit in such a receiver in which noise caused by station movement in selecting a station is eliminated.

Recently, thanks to the rapid development of electronics, a receiver in which an electronic preset station selection operation can be carried out has been proposed. This preset type receiver is so designed that a memory is addressed by the outputs of a band selecting switch and a channel selecting switch, the signals of preset band and channel are read into the address in the memory from an up-down counter during-manual setting operation, and the output of the up-down counter is simultaneously converted into an analog signal which is supplied to a varicap diode forming a tuning circuit, whereby the radio wave of the desired band and channel being preset can be received. In this case, the channel selecting switch is made of, for instance, a non-lock type switch, while the band selecting switch is made of, for instance, a rotary switch. Thereafter, whenever a channel selecting signal outputted by the channel selecting switch and a band selecting signal outputted by the band selecting switch are detected, the output of the memory is inputted into the up-down counter to control the receiver.

However, when the preset station selection is carried out by operating the band selecting switch and the channel selecting switch with the electronic tuning type receiver organized as described above, the receiver tuning is adjusted to stabilize at an aimed station. Therefore, the above-described receiver is disadvantageous in that noise is produced during this station adjustment.

SUMMARY OF THE INVENTION

Accordingly, an object of the invention is to forcibly effect muting in selecting a station and to suspend the muting in presetting a station, to thereby eliminate the above-described difficulty accompanying the conventional electronic tuning type receiver.

Briefly, this is accomplished by providing power to the muting input terminal of an IF amplifier through diodes connected to each of the channel selection switches. A normally closed switch is connected in series with the diodes and is operable together with a presetting switch to interrupt the muting signal during the presetting operation.

BRIEF DESCRIPTION OF THE DRAWING

In the accompanying drawing, the single FIGURE is a block diagram illustrating one example of the muting circuit in the electronic tuning type receiver, according to this invention.

DETAILED DESCRIPTION OF THE INVENTION

FIG. 1 shows one example of a muting circuit in an electronic tuning type receiver according to this invention which is especially suitable for use in motor vehicles. Referring to FIG. 1, reference numeral 1 designates a pulse generator for generating an up-down pulse U/D and a clock pulse KC through manual operation; reference numeral 2, a binary up-down counter which employs the up-down pulse U/D outputted by the pulse generator 1 as a count control signal, to count the clock pulse KC applied thereto; reference numeral 3, a frequency display unit for receiving several higher significant bits of the count output of the up-down counter 2 to carry out digital display; and reference numeral 4, a pulse synthesizer in which output signals at stages obtained by subjecting an oscillation signal to frequency division are selected and synthesized with the aid of the output signal of the up-down counter 2, to thereby obtain a serial pulse train having the number of pulses which corresponds to the output of the up-down counter 2. Such a pulse synthesizer is described in U.S. Pat. No. 3,603,977.

Furthermore, in FIG. 1, reference numeral 5 designates a low-pass filter which forms a digital-to-analog (D-A) converter with the pulse synthesizer 4; reference numeral 6, a band selecting switch which operates to supply the DC output of the low-pass filter 5 to a tuning circuit (not shown) to thereby select a desired band, and has stationary contacts a through c provided correspondingly to bands A through C; reference characters 7a through 7e, channel selecting switches each made up of a non-lock type switch; reference numeral 8, another band selecting switch having stationary contacts a through c which are provided respectively for the bands A, B and C, the band selecting switch 8 operating in association with the aforementioned band selecting switch 6; and reference numeral 9, a read-write memory which operates to receive and latch the outputs of the channel selecting switches 7a through 7e and the band selecting switch 8, and to store the output of the up-down counter 2 at an address specified by the signals or to read out the data stored at an address specified to supply it to the up-down counter 2.

In addition, referring to FIG. 1, reference numeral 10 designates a control circuit receiving the outputs of the channel selecting switches 7a through 7e and the band selecting switch 8. When a preset switch 11 is in "off" state, a load signal L is applied from the circuit 10 to the up-down counter 2 in response to the provision of the outputs of the channel selecting switches 7a through 7e, and when the preset switch 11 is in "on" state, a write signal W is supplied to the read-write memory 9. Reference characters 12a through 12d designate diodes having anodes connected to the output sides of the channel selecting switches 7a through 7e and cathodes connected together and reference numeral 13 designates a normally closed switch for supplying the set outputs of the channel selecting switches 7a through 7e through a resistor 14 to a muting control terminal 16 of an intermediate frequency amplifier 15, the switch 13 operating in association with the preset switch 11.

With the thus organized muting circuit of the electronic tuning type receiver, if an up pulse U, for instance, is generated by operating (turning) the pulse generator 1, it is supplied to the up-down counter 2 and, accordingly, the up-down counter 2 carries out a successive up-count. The parallel count output of the up-down counter 2 is applied to the pulse synthesizer 4, where the signals at the stages obtained by subjecting the oscillation signal to frequency division are selectively combined in correspondence to the output of the up-down counter 2 into a serial pulse train having the corresponding number of pulses. This output signal of the pulse synthesizer 4 is applied to the low-pass filter 5, where the high frequency component is removed from the output signal, so that a DC voltage signal corresponding to the output of the up-down counter 2 can be obtained. This DC voltage signal is applied to a varicap diode in a tuning circuit selected by the band selecting switch 6 so that the corresponding frequency tuning is effected described above is the electronic tuning operation in the case where a station is manually selected.

On the other hand, when one of the channel selecting switches 7a through 7e is selectively operated, the high ("H") level output of the switch thus operated is applied through the diode (12a–12e), the switch 13 and the resistor 14 to the muting control terminal 16 of the intermediate frequency amplifier 15. As a result, during the "on" period of the channel selecting switch (7a–7e), that is, during the station selecting operation, the "H" level signal is forcibly applied to the muting control terminal 16. Accordingly, the generation of noise which may be caused by station movement in selecting a station can be prevented, that is, a stable station selecting operation is obtained. The higher significant bits of the output of the up-down counter 2 are applied to the frequency display unit 3, where the frequency being received is digitally displayed. Described above is the electronic tuning operation in the case where a preset station is selected.

Now, the case where selection of a station is preset will be described.

Under the condition that a desired station has been selected by manual operation, first the preset switch 11 is turned on, and then one of the channel selecting switches 7a through 7e corresponding to a channel to be preset is turned on. As a result, the write signal W is applied from the control circuit 10 to the read-write memory 9, so that the count output of the up-down counter 2, that is, a digital signal representative of the tuned frequency is stored at an address which is specified by the band selecting switch 8 and the channel selecting switch (7a-7e) turned on. Similarly as in the above-described case, desired frequencies can be preset for other channels. In this case, when the preset switch 11 is closed, the switch 13 operated in association with the preset switch 11 is opened. Accordingly, even if any one of the channel selecting switches 7a through 7e has been closed, the muting is forcibly suspended. Therefore, during the presetting operation, the muting is not effected; that is, a receiving sound is outputted reflecting the signal receiving condition as it is. Thus, the presetting operation can be carried out by monitoring the signal receiving condition basing on the preset value.

In the case of carrying out the preset station selection, an address where a digital signal corresponding to a desired station is stored is selected by selectively operating the band selecting switch 8 and the channel selecting switches 7a and 7e. As the preset switch 11 is in the "Off" state, the load signal L is supplied from the control circuit 10 to the up-down counter 2. As a result, the read-write memory 9 reads, as an address, the outputs of the band select switch 8 and the channel selecting switch. The read signal of the read-write memory 9 is inputted, in a parallel mode, into the up-down counter 2. The output of the up-down counter 2 is applied to the pulse synthesizer 4. Thus, similarly as in the case of the manual operation, the station selecting operation is carried out. Thereafter, the preset station selection in the same band can be changed merely by selectively turning on the channel selecting switches 7a through 7e. In addition, in the case where station selection is effected in a different band but in the same channel, only the band selecting switch 8 is operated. In this case, the "off" output of the switch is detected by the control circuit 10 to control the up-down counter 2, as a result of which the preset station selection is carried out similarly as in the above-described case. In the above-described preset station selection also, the "H" level output of the channel selecting switch is applied to the muting control terminal of the intermediate frequency amplifier 15 by selectively operating the channel selecting switches 7a through 7e, as a result of which the muting is forcibly effected. Therefore, the production of noise which may be caused by station movement during the station selecting operation can be prevented. As to a method for effecting muting, a variety of methods have been proposed and the operation thereof will be obvious to one of ordinary skill in the art and need not be explained in detail.

As is apparent from the above description, in the muting circuit of the electronic tuning type receiver according to the invention, the muting is forcibly effected by using the output signal of the channel selecting switch, and when the preset switch is turned on, the muting is forcibly suspended. Accordingly, the production of noise which may be caused by station movement during the preset station selection can be positively prevented, and the signal receiving condition itself can be monitored during the presetting operation. Thus, the present invention provides significant advantages.

What is claimed is:

1. An electronic tuning type receiver of the type in which the output from a manually controlled up-down counter is used to control the tuning section of the receiver, and in which the contents of a read-write memory addressed by the actuation of band selection and channel selection switches may be loaded into said counter to thereby cause said tuning section to select a desired band and channel, said receiver further comprising:
    a preset switch movable between a first position and a second position in which it provides at its output a preset signal;
    a control circuit for detecting the actuation of at least one of said band selection and channel selection switches and providing a load signal in response to which the addressed contents of said memory are loaded into said counter and a write-signal in response to which the contents of the counter are loaded into the addressed memory, said control circuit providing said load and write signals when said preset switch is in said first and second positions, respectively;
    muting means for muting the signal in said receiver in response to a muting signal;
    coupling means for supplying a muting signal to said muting means in response to actuation of one of said channel selection switches; and
    a muting control switch connected between said coupling means and said muting means for interrupting said muting signal when said preset switch is in said second position.

2. A receiver according to claim 1, wherein said coupling means comprises a plurality of diodes having their input terminals connected to respective ones of said channel selection switches and having their output terminals coupled together to form a common output terminal at which said muting signal is provided.

3. A receiver according to claim 2, wherein said muting means is the muting input terminal of an IF amplifier.

4. A receiver according to claim 2, further comprising a digital-to-analog converter for receiving the output from said counter and controlling said tuning section.

5. A receiver according to claim 4, wherein said digital-to-analog converter comprises a pulse synthesizer for receiving the output from said up-down counter and providing at its output a serial pulse train having a number of pulses corresponding to said counter output, and a low-pass filter for receiving the output of said pulse synthesizer and providing at its output an analog voltage which controls said tuning section.

* * * * *